(12) United States Patent
Ogiwara et al.

(10) Patent No.: US 10,672,468 B2
(45) Date of Patent: Jun. 2, 2020

(54) MEMORY DEVICE

(71) Applicant: TOSHIBA MEMORY CORPORATION, Minato-ku (JP)

(72) Inventors: Ryu Ogiwara, Yokohama (JP);
Daisaburo Takashima, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/353,292

(22) Filed: Mar. 14, 2019

(65) Prior Publication Data
US 2019/0295637 A1    Sep. 26, 2019

(30) Foreign Application Priority Data

Mar. 20, 2018    (JP) .................................. 2018-053303

(51) Int. Cl.
*G11C 13/00*    (2006.01)

(52) U.S. Cl.
CPC ........ *G11C 13/003* (2013.01); *G11C 13/0038* (2013.01); *G11C 13/0004* (2013.01); *G11C 13/0061* (2013.01); *G11C 13/0069* (2013.01); *G11C 2213/72* (2013.01)

(58) Field of Classification Search
None
See application file for complete search history.

(56) References Cited

U.S. PATENT DOCUMENTS

| | | | |
|---|---|---|---|
| 6,750,469 B2 | 6/2004 | Ichihara et al. | |
| 6,778,420 B2 * | 8/2004 | Parkinson | G11C 13/0004 365/100 |
| 7,729,163 B2 | 6/2010 | Ramani et al. | |
| 9,117,505 B2 | 8/2015 | Kang | |
| 9,496,035 B2 | 11/2016 | Di Vincenzo et al. | |
| 10,210,928 B2 * | 2/2019 | Tiburzi | G11C 5/147 |
| 2010/0027317 A1 * | 2/2010 | Maejima | G11C 5/02 365/148 |

(Continued)

FOREIGN PATENT DOCUMENTS

| | | |
|---|---|---|
| JP | 2003-100085 | 4/2003 |
| JP | 3749847 | 3/2006 |
| JP | 2011-517829 | 6/2011 |
| JP | 5212757 | 6/2013 |

OTHER PUBLICATIONS

Cho, W., et al. "A 0.18μm 3.0V 64Mb Non-Volatile Phase-Transition Random-Access Memory (PRAM)", 2004 IEEE International Solid-State Circuits Conference (ISSCC 2004) / Session 2 / Non-Volatile Memory / 2.1, 2004, 9 pages.

(Continued)

*Primary Examiner* — Tan T. Nguyen
(74) *Attorney, Agent, or Firm* — Oblon, McClelland, Maier & Neustadt, L.L.P.

(57) ABSTRACT

According to one embodiment, a memory device includes a first circuit including a resistance change memory element capable of setting a low resistance state or a high resistance state according to a falling speed of an applied voltage, and a first rectifier element connected in series to the resistance change memory element, and a second circuit including a current source, and a second rectifier element connected in series to the current source, the second circuit having a mirror relationship with the first circuit.

30 Claims, 13 Drawing Sheets

(56) References Cited

U.S. PATENT DOCUMENTS

| | | | | |
|---|---|---|---|---|
| 2011/0128773 A1* | 6/2011 | Azuma | ............... | G11C 13/0007 365/148 |
| 2012/0039110 A1* | 2/2012 | Maejima | ............ | G11C 13/0004 365/148 |
| 2012/0075912 A1* | 3/2012 | Hosono | .............. | G11C 13/0002 365/148 |
| 2013/0215669 A1* | 8/2013 | Haukness | .......... | G11C 13/0007 365/148 |
| 2019/0295637 A1* | 9/2019 | Ogiwara | ............ | G11C 13/0038 |

OTHER PUBLICATIONS

Cho, W., et al. A 0.18-μm 3.0-V 64-Mb Nonvolatile Phase-Transition Random Access Memory (PRAM), IEEE Journal of Solid-State Circuits, vol. 40, No. 1, 2005, 8 pages.

Kang, S., et al. "A 0.1-μm 1.8-V 256-Mb Phase-Change Random Access Memory (PRAM) With 66-MHz Synchronous Burst-Read Operation", IEEE Journal of Solid-State Circuits, vol. 42, No. 1, 2007, 9 pages.

Oh, H., et al. "Enhanced Write Performance of a 64-Mb Phase-Change Random Access Memory", IEEE Journal of Solid-State Circuits, vol. 41, No. 1, 2006, 5 pages.

Papandreou, N., et al. "Drift-Resilient Cell-State Metric for Multilevel Phase-Change Memory", 2011 International Electron Devices Meeting, 2011, 4 pages.

Sebastian, A., et al. "Non-resistance-based cell-state metric for phase-change memory", Journal of Applied Physics, vol. 110, No. 8, 2011, 7 pages.

Stanisavljevic, M., et al. "Phase-Change Memory: Feasibility of Reliable Multilevel-cell Storage and Retention at Elevated Temperatures", 2015 IEEE International Reliability Physics Symposium, 2015, 6 pages.

* cited by examiner

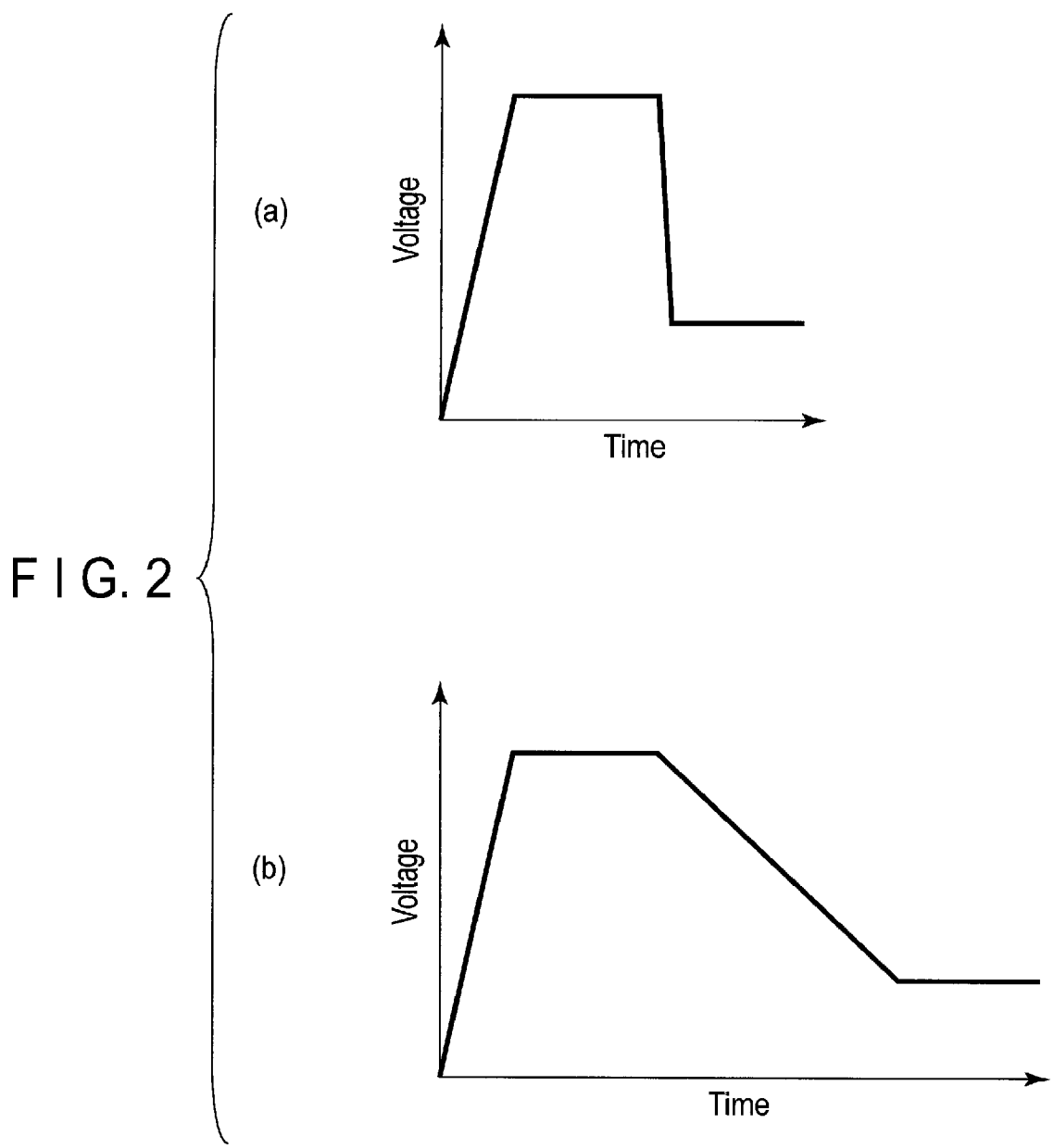
F I G. 2

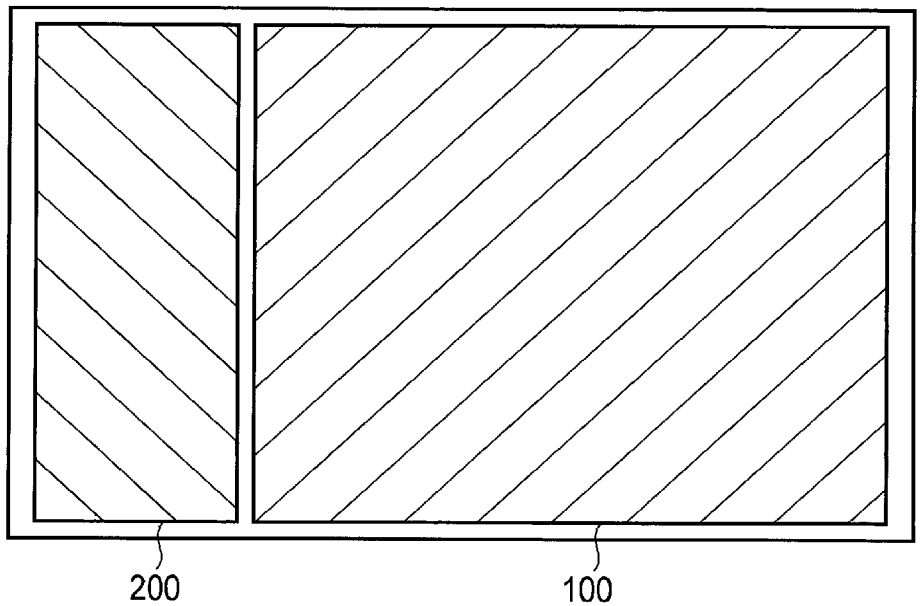
F I G. 4A
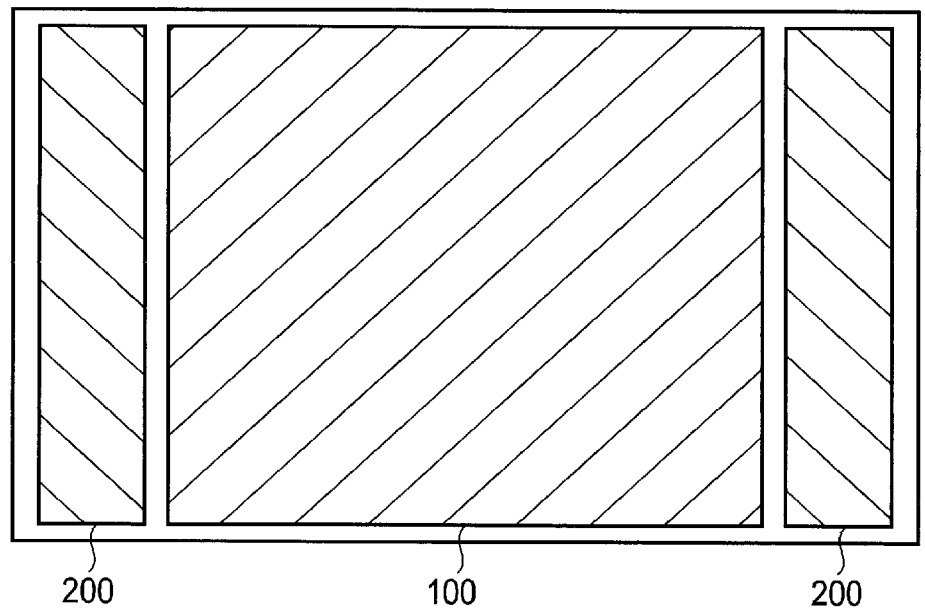
F I G. 4B

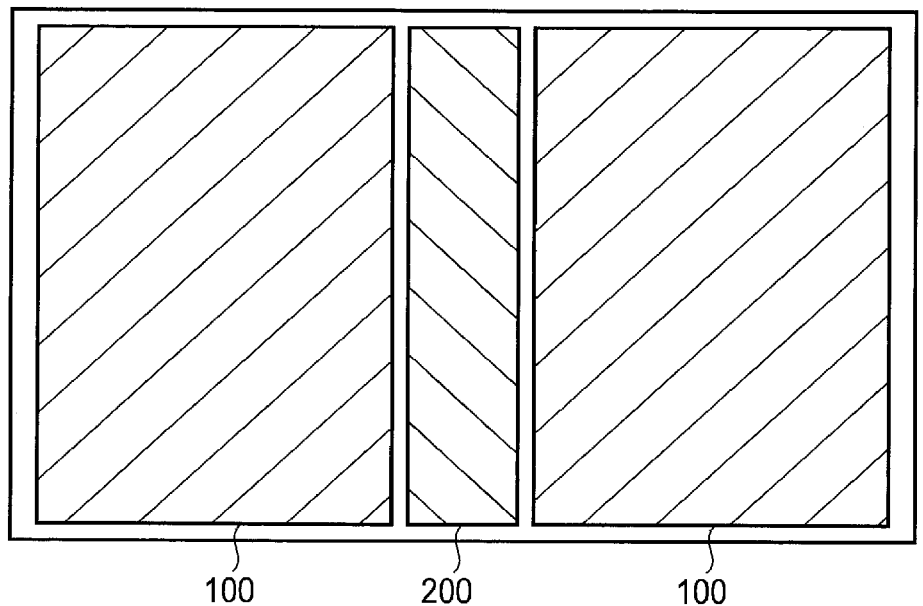
F I G. 4C
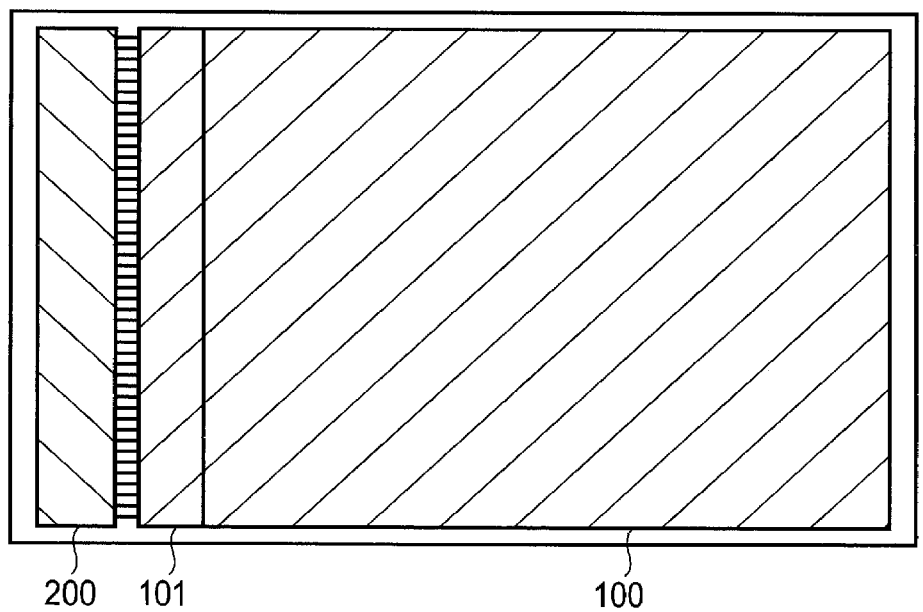
F I G. 4D

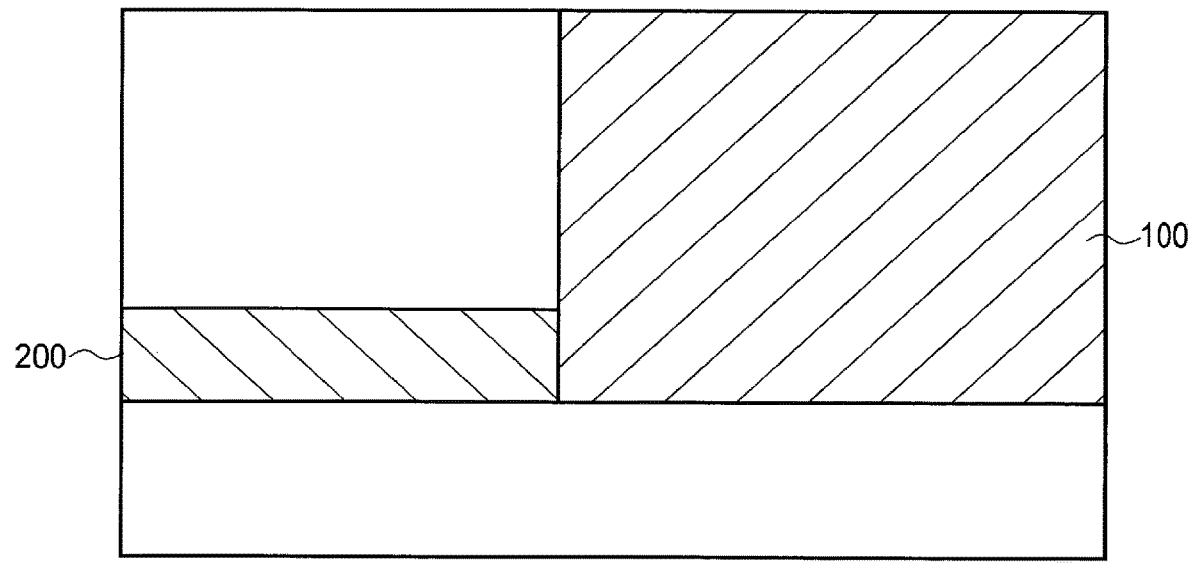
F I G. 5A
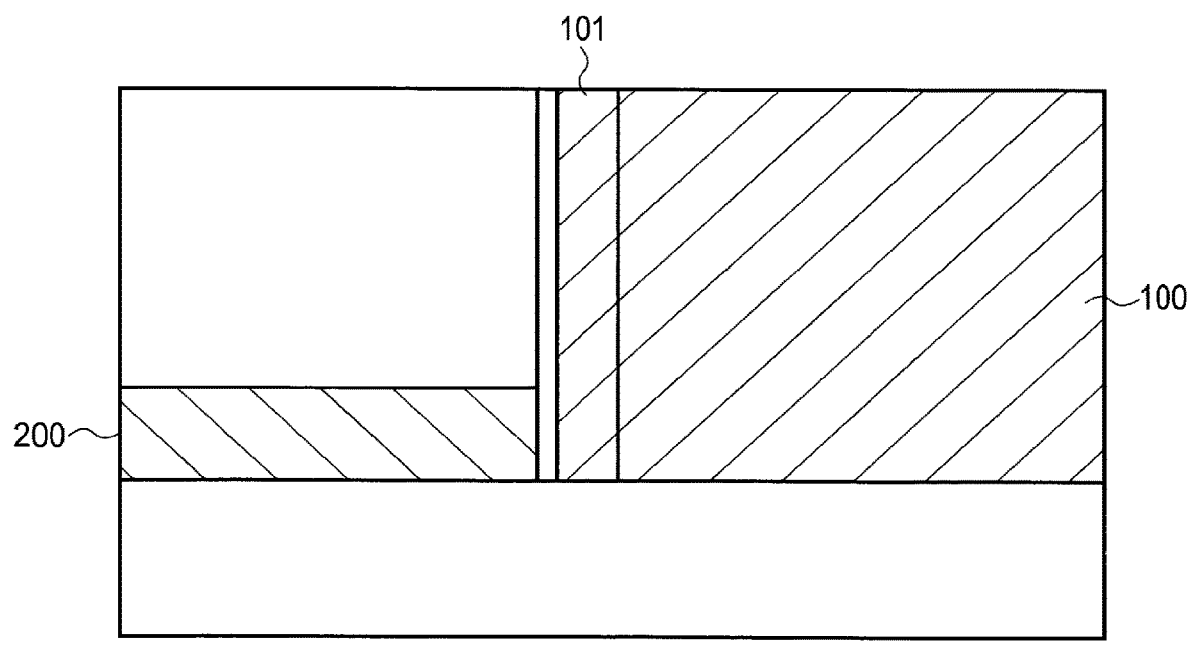
F I G. 5B

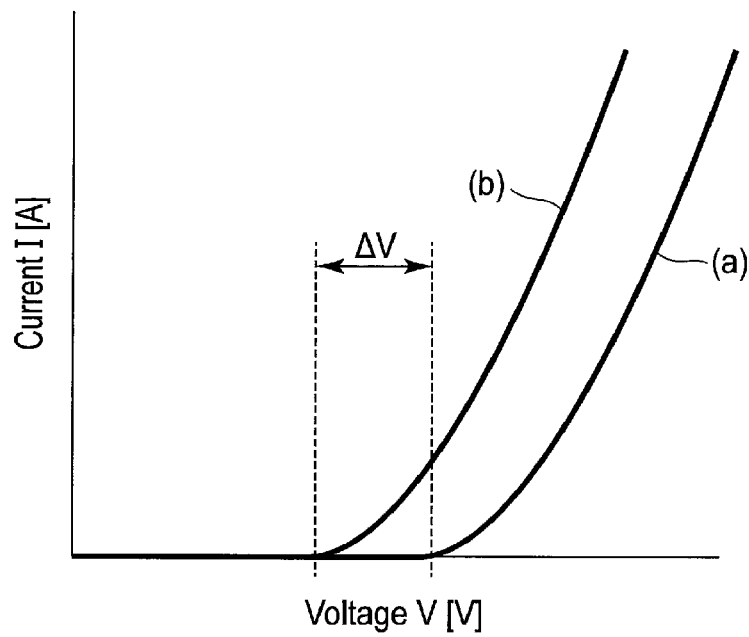
F I G. 10A
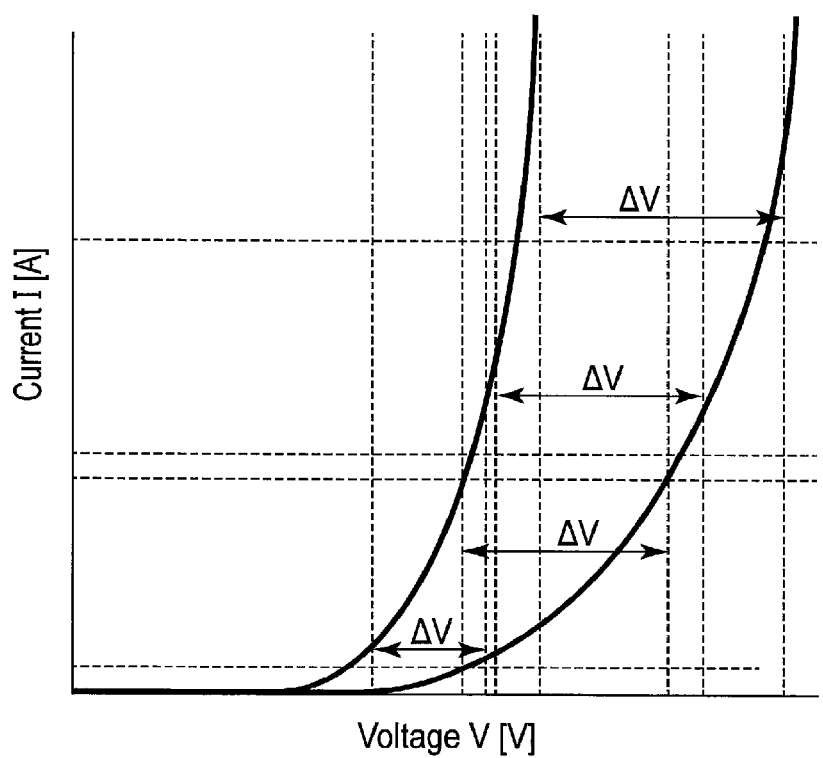
F I G. 10B

MEMORY DEVICE

CROSS-REFERENCE TO RELATED APPLICATIONS

This application is based upon and claims the benefit of priority from Japanese Patent Application No. 2018-053303, filed Mar. 20, 2018, the entire contents of which are incorporated herein by reference.

FIELD

Embodiments described herein relate generally to a memory device.

BACKGROUND

There has been proposed a memory device (semiconductor integrated circuit device) including a MOS transistor, a diode, and a resistance change memory element such as a phase change memory element which are integrated on a semiconductor substrate. The resistance change memory element is capable of setting a low resistance state (Set state) and a high resistance state (Reset state) according to a falling speed (a low falling speed and a high falling speed) of an applied voltage.

However, in the above memory device using the resistance change memory element, it is not always easy to perform appropriate falling voltage control at a low falling speed. In particular, control in a case where a rectifier element such as a diode is used as a selector element has not been conventionally proposed.

Thus, in particular, there is a demand for a memory device capable of performing appropriate falling voltage control on a resistance change memory element in a case where a rectifier element such as a diode is used as a selector element.

BRIEF DESCRIPTION OF THE DRAWINGS

FIG. 2 is graphs schematically illustrating an applied voltage when a resistance state of a resistance change memory element in the memory device according to the first embodiment is set.

FIG. 4A is a plan view schematically illustrating a first example of a positional relationship between the memory cell array region and a peripheral circuit region in the memory device according to the first embodiment.

FIG. 4B is a plan view schematically illustrating a second example of the positional relationship between the memory cell array region and the peripheral circuit region in the memory device according to the first embodiment.

FIG. 4C is a plan view schematically illustrating a third example of the positional relationship between the memory cell array region and the peripheral circuit region in the memory device according to the first embodiment.

FIG. 4D is a plan view schematically illustrating a fourth example of the positional relationship between the memory cell array region and the peripheral circuit region in the memory device according to the first embodiment.

FIG. 5A is a sectional view schematically illustrating a first example of a positional relationship between the memory cell array region and the peripheral circuit region in the memory device according to the first embodiment.

FIG. 5B is a sectional view schematically illustrating a second example of the positional relationship between the memory cell array region and the peripheral circuit region in the memory device according to the first embodiment.

FIG. 10A is a graph illustrating voltage-current characteristics of a first rectifier element and a second rectifier element in a case where only built-in potential of the first rectifier element and that of the second rectifier element are different from each other.

FIG. 10B is a graph illustrating voltage-current characteristics of a first rectifier element and a second rectifier element in a case where built-in potential and a shape of a function of the first rectifier element and those of the second rectifier element are different from each other.

DETAILED DESCRIPTION

In general, according to one embodiment, a memory device includes: a first circuit including a resistance change memory element capable of setting a low resistance state or a high resistance state according to a falling speed of an applied voltage, and a first rectifier element connected in series to the resistance change memory element; and a second circuit including a current source, and a second rectifier element connected in series to the current source, the second circuit having a mirror relationship with the first circuit.

Hereinbelow, embodiments will be described with reference to the drawings.

Embodiment 1

Figure 1A:
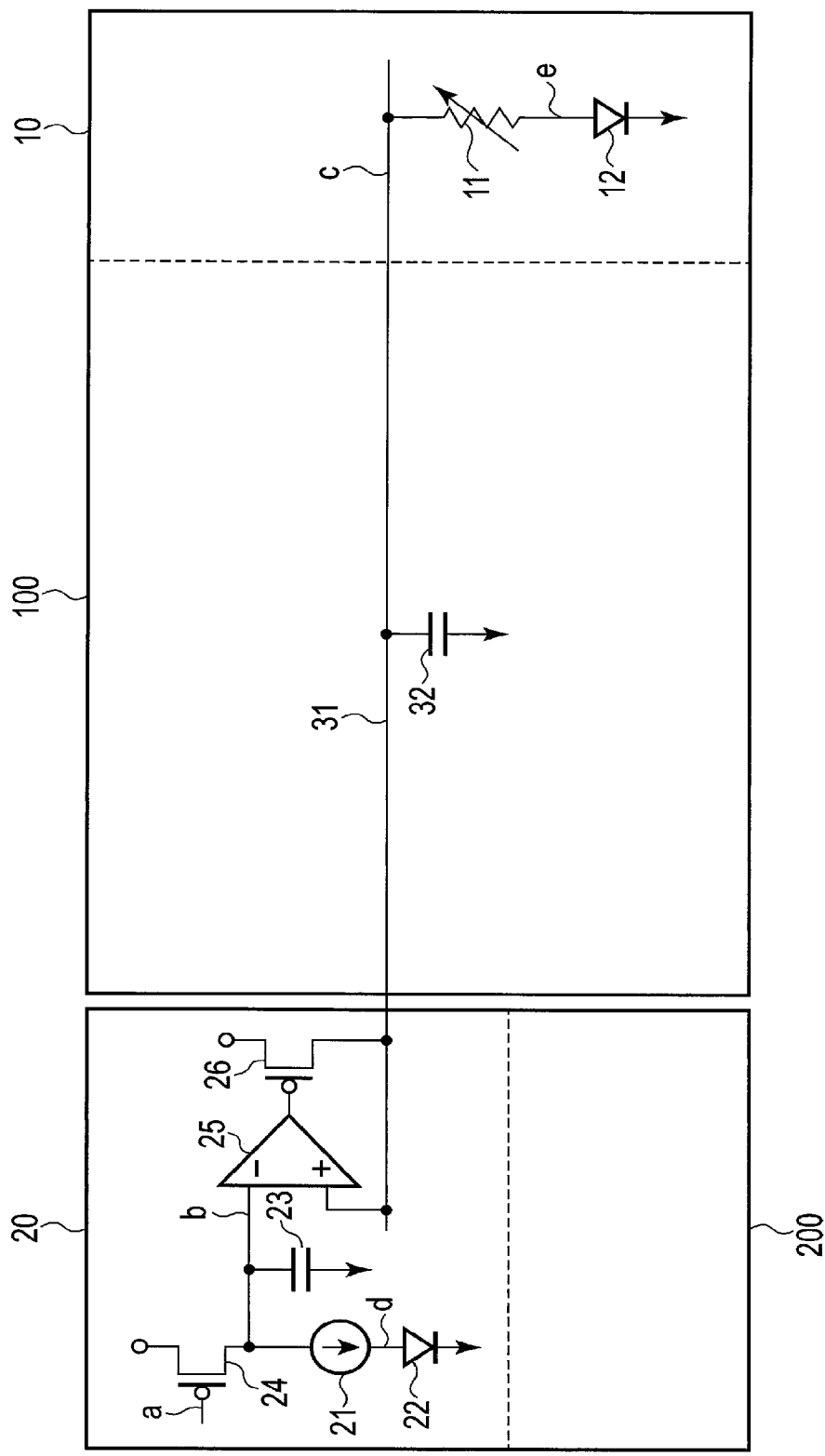
FIG. 1A is a circuit diagram illustrating a configuration of a memory device according to a first embodiment.

FIG. 1A is a circuit diagram illustrating a configuration of a memory device according to a first embodiment.

The memory device illustrated in FIG. 1A includes a first circuit 10 and a second circuit 20. The first circuit 10 has a mirror relationship with the second circuit 20 (a transistor 26 is controlled through an operational amplifier 25 so that a potential at a "c" point of the first circuit 10 becomes equal to a potential at a "b" point of the second circuit 20). The first circuit 10 and the second circuit 20 are formed on the same semiconductor substrate.

The first circuit 10 includes a resistance change memory element 11 and a first rectifier element 12 which is connected in series to the resistance change memory element 11.

The resistance change memory element 11 is capable of selectively setting either a low resistance state (Set state) or a high resistance state (Reset state, a resistance state having a higher resistance than the resistance in a low resistance state) according to a falling speed of an applied voltage. For example, a phase change memory (PCM) element, an interfacial phase change memory (iPCM) element, a resistive RAM (ReRAM) element, or a conduction-bridge RAM (CBRAM) element is used as the resistance change memory element 11. Specifically, the resistance change memory element 11 may contain germanium (Ge), antimony (Sb), and tellurium (Te).

A combination of the first rectifier element 12 and a second rectifier element 22 should be particularly noted in FIG. 1A. Specifically, there are three ways of combination: a case where the first rectifier element 12 and the second rectifier element 22 are both diodes; a case where the first rectifier element 12 and the second rectifier element 22 are both predetermined two-terminal switch elements (each of which is a two-terminal switch element containing elements which are the same as elements contained in the resistance change memory element 11 and formed of a material having a composition ratio which is the same as a composition ratio of a material of the resistance change memory element 11, a two-terminal switch element containing elements which are not the same as elements contained in the resistance change memory element 11, or a two-terminal switch element containing elements which are the same as elements contained in the resistance change memory element 11 and formed of a material having a composition ratio which is different from a composition ratio of a material of the resistance change memory element 11); and a case where the first rectifier element 12 is a predetermined two-terminal switch element (which is a two-terminal switch element containing elements which are the same as elements contained in the resistance change memory element 11 and formed of a material having a composition ratio which is the same as a composition ratio of a material of the resistance change memory element 11, a two-terminal switch element containing elements which are not the same as elements contained in the resistance change memory element 11, or a two-terminal switch element containing elements which are the same as elements contained in the resistance change memory element 11 and formed of a material having a composition ratio which is different from a composition ratio of a material of the resistance change memory element 11) and the second rectifier element 22 is a diode. When a memory cell array of the first circuit 10 has a three-dimensional structure, it may be difficult for a peripheral circuit of the second circuit 20 to also have a three-dimensional structure. In such a case, the first circuit (three-dimensional structure) 10 may be formed with the predetermined two-terminal switch element (which is a two-terminal switch element containing elements which are the same as elements contained in the resistance change memory element 11 and formed of a material having a composition ratio which is the same as a composition ratio of a material of the resistance change memory element 11, a two-terminal switch element containing elements which are not the same as elements contained in the resistance change memory element 11, or a two-terminal switch element containing elements which are the same as elements contained in the resistance change memory element 11 and formed of a material having a composition ratio which is different from a composition ratio of a material of the resistance change memory element 11), and the second circuit (two-dimensional structure) 20 may be formed with a diode.

FIG. 2 is graphs schematically illustrating an applied voltage when a resistance state of the resistance change memory element 11 is set. FIG. 2(a) is a graph illustrating an applied voltage when a high resistance state (Reset state) is set. FIG. 2(b) is a graph illustrating an applied voltage when a low resistance state (Set state) is set. When a high resistance state is set, as illustrated in FIG. 2(a), a voltage is applied (a current is passed) to the resistance change memory element 11 to increase the temperature of the resistance change memory element 11, and the applied voltage is then rapidly lowered. Accordingly, the resistance change memory element 11 is rapidly cooled. Thus, the material of the resistance change memory element 11 is brought into an amorphous state in a case of a PCM. The material of the resistance change memory element 11 is brought into a high resistive crystalline state in a case of an iPCM. The material of the resistance change memory element 11 is brought into a state in which a line of conductive grains is broken in a case of an ReRAM. As a result, the resistance change memory element 11 has a relatively high resistance value. When a low resistance state is set, as illustrated in FIG. 2(b), a voltage is applied (a current is passed) to the resistance change memory element 11 to increase the temperature of the resistance change memory element 11, and the applied voltage is then slowly lowered. Accordingly, the resistance change memory element 11 is slowly cooled. Thus, the material of the resistance change memory element 11 is brought into a crystalline state in a case of a PCM. The material of the resistance change memory element 11 is brought into a low resistive crystalline state in a case of an iPCM. The material of the resistance change memory element 11 is brought into a state in which lines of conductive grains is connected in a case of an ReRAM. As a result, the resistance change memory element 11 has a relatively low resistance value.

As already described, a rectifier element used as a selector is a diode or a predetermined two-terminal switch element (which is a two-terminal switch element containing elements which are the same as elements contained in the resistance change memory element 11 and formed of a material having a composition ratio which is the same as a composition ratio of a material of the resistance change memory element 11, a two-terminal switch element containing elements which are not the same as elements contained in the resistance change memory element 11, or a two-terminal switch element containing elements which are the same as elements contained in the resistance change memory element 11 and formed of a material having a composition ratio which is different from a composition ratio of a material of the resistance change memory element 11). In the predetermined two-terminal switch element, when a voltage applied between the two terminals is equal to or less than a threshold, the switch element is in a "high resistance" state. When a voltage applied between the two terminals is equal to or more than the threshold, the switch element is changed to a "low resistance" state. The predetermined two-terminal switch element includes a unipolar device having the above function in both polarities of the voltage and a bipolar device having the above function in only one polarity of the voltage. The predetermined two-terminal switch element may contain at least one kind of chalcogen element selected from the group consisting of Te, Se, and S. Alternatively, the switch element may contain chalcogenide which is a compound containing the chalcogen element. Alternatively, the switch element may contain at least one kind of element selected from the group consisting of B, Al, Ga, In, C, Si, Ge, Sn, As, P, and Sb.

The second circuit 20 includes a current source (constant current source) 21, the second rectifier element 22, a capacitor 23, a transistor 24, the operational amplifier 25, and the transistor 26.

The second rectifier element 22 is connected in series to the current source 21. For example, the current source 21 is constituted by one resistor. The capacitor 23 is connected in parallel to the series connection of the current source 21 and the second rectifier element 22, and performs charge and discharge operations. The transistor 24 is connected in series to the series connection of the current source 21 and the second rectifier element 22, and controls the charge and discharge operations of the capacitor 23. A voltage of the capacitor 23 is applied to an inverting input of the operational amplifier 25. A drain of the transistor 26 is connected to a non-inverting input of the operational amplifier 25. The non-inverting input of the operational amplifier 25 is also connected to the first circuit 10. An output of the operational amplifier 25 is connected to a gate of the transistor 26.

Figure 1B:
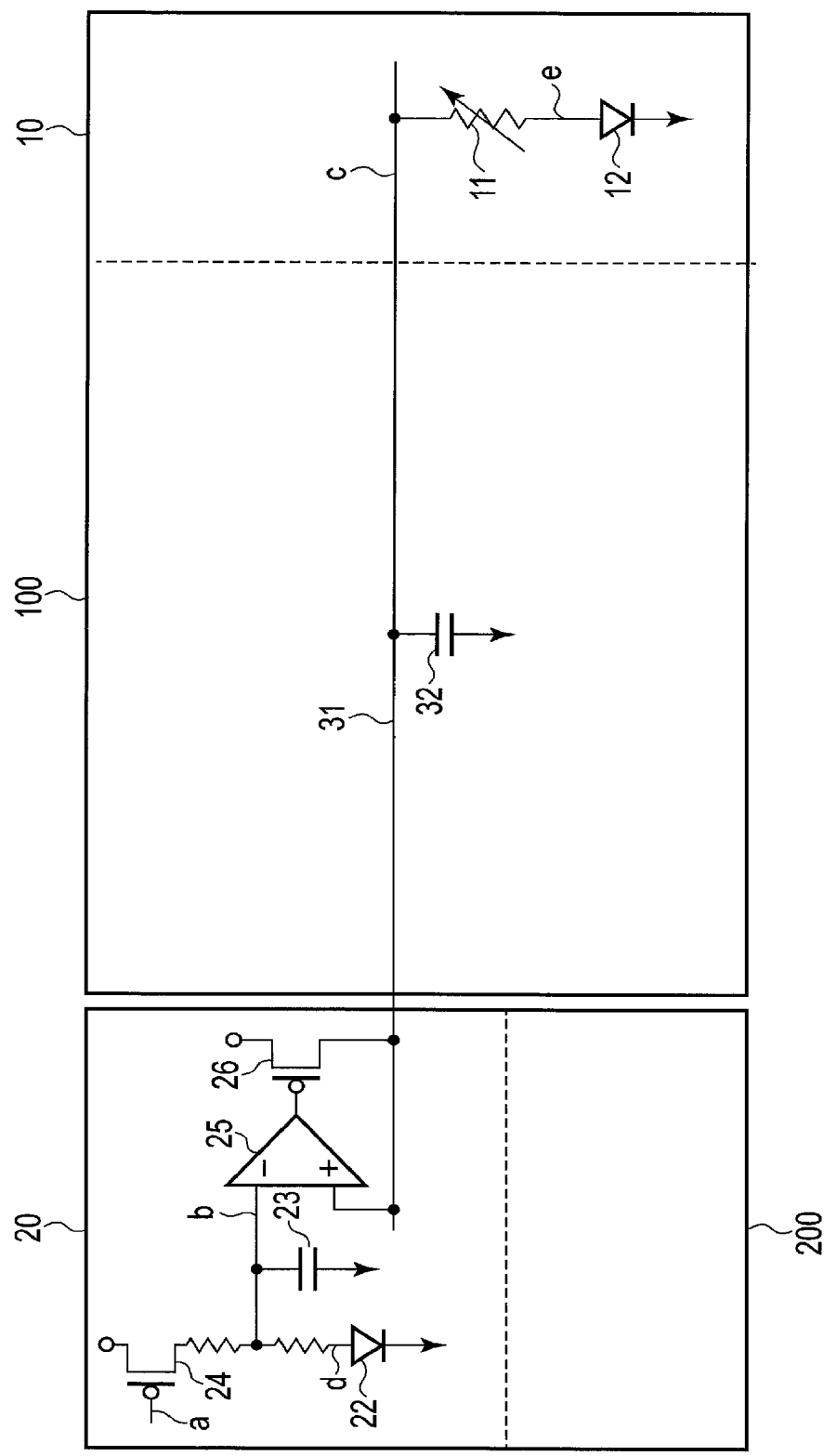
FIG. 1B is a circuit diagram illustrating a configuration of a modification of a memory device according to the first embodiment.

The second circuit 20 may have a structure as shown in FIG. 1B. FIG. 1B shows a view in which a current source is constituted by a PMOS transistor 24 and an internal resistive component of the rectifier element 22.

The first circuit 10 and the second circuit 20 are connected to each other through a bit line (wiring line) 31. The bit line 31 includes a capacitance component. Thus, a capacitor 32 is equivalently shown as the capacitance component.

The first circuit 10 is disposed in a memory cell array region 100. The second circuit 20 is disposed in a peripheral circuit region 200.

Figure 3:
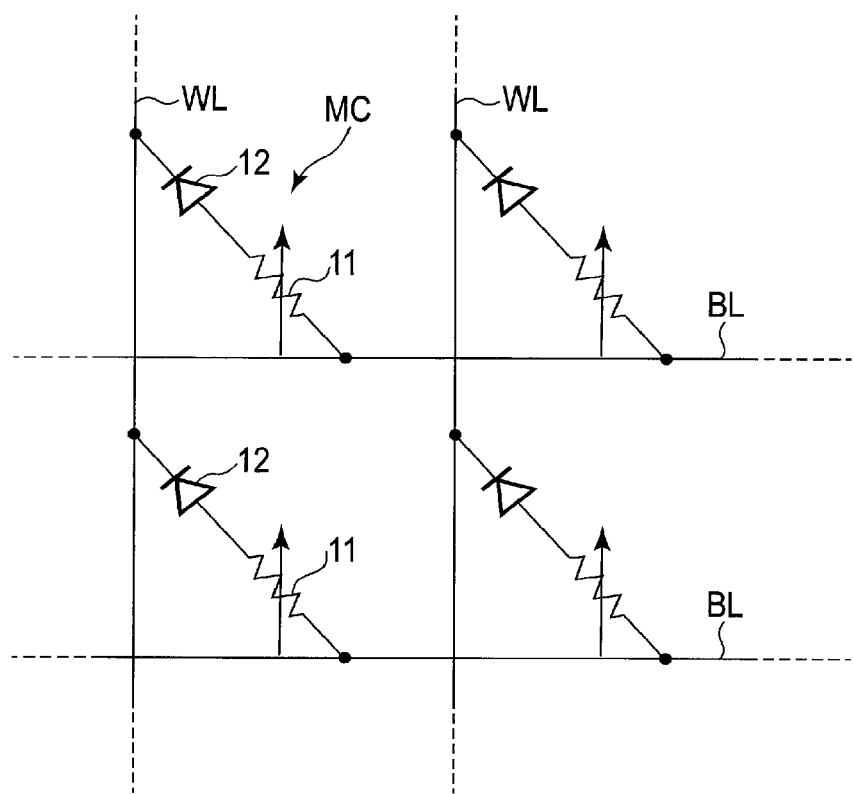
FIG. 3 is a circuit diagram illustrating a configuration of a memory cell array region in the memory device according to the first embodiment.

FIG. 3 is a circuit diagram illustrating the configuration of the memory cell array region 100. The series connection of the resistance change memory element 11 and the rectifier element 12 constitutes a memory cell MC. A plurality of memory cells MC are arranged in an array form. One end of the memory cell MC is connected to a word line WL, and the other end of the memory cell MC is connected to a bit line BL.

FIG. 4A to FIG. 4D are plan views schematically illustrating examples of a positional relationship between the memory cell array region 100 and the peripheral circuit region 200. As illustrated in FIG. 4A, the memory cell array region 100 and the peripheral circuit region 200 are adjacent to each other. In FIG. 4B, the memory cell array region 100 is sandwiched between the peripheral circuit regions 200. In FIG. 4C, the peripheral circuit region 200 is sandwiched between the memory cell array regions 100. In FIG. 4D, the current source 21 and the second rectifier element 22 are excluded from the peripheral circuit region 200, and a region 101 which includes the current source 21 and the second rectifier element 22 is included in the memory cell array region 100.

FIG. 5A and FIG. 5B are sectional views schematically illustrating examples of a positional relationship between the memory cell array region 100 and the peripheral circuit region 200. As illustrated in FIG. 5A, the memory cell array region 100 has a three-dimensional structure (stereoscopic structure), and the peripheral circuit region 200 has a two-dimensional structure (planar structure). In FIG. 5B, the current source 21 and the second rectifier element 22 are excluded from the peripheral circuit region 200 having a two-dimensional structure, and the region 101 which includes the current source 21 and the second rectifier element 22 is included in the memory cell array region 100 having a three-dimensional structure.

Figure 6:
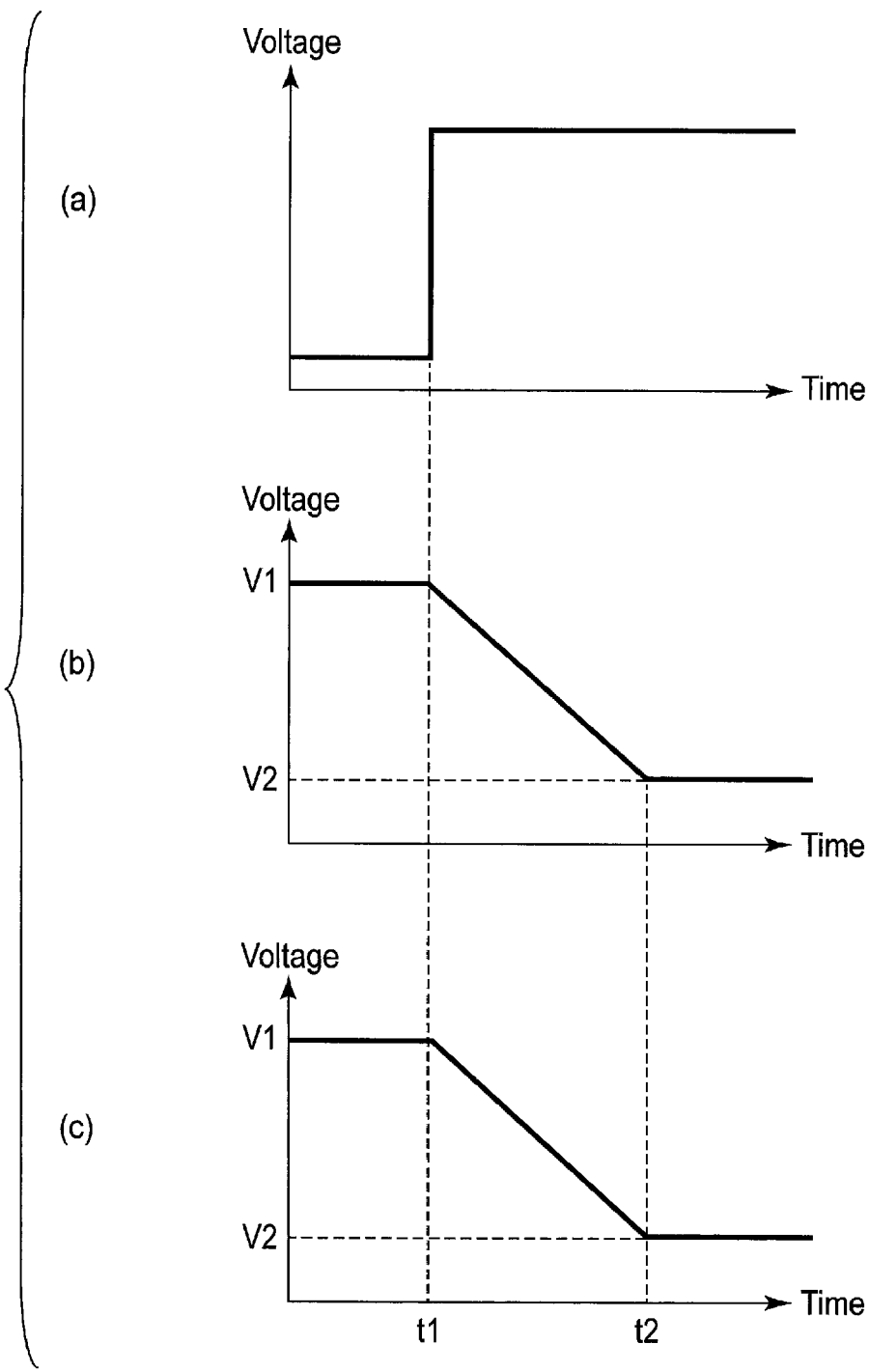
FIG. 6 is timing charts illustrating an operation when the resistance change memory element in the memory device according to the first embodiment is set to a low resistance state.

FIG. 6 is timing charts illustrating an operation when the resistance change memory element 11 is set to a low resistance state. FIG. 6(a) illustrates a voltage applied to a gate of the transistor 24 (a voltage at an "a" point of FIG. 1A). FIG. 6(b) illustrates a voltage of the inverting input of the operational amplifier 25 (a voltage at the "b" point of FIG. 1A). FIG. 6(c) illustrates a voltage of the bit line 31 (a voltage at the "c" point of FIG. 1A).

The transistor 24 is in an ON state, and the capacitor 23 is charged with a predetermined voltage V1 until time t1. When the transistor 24 is turned to an OFF state at the time t1, the capacitor 23 starts discharging. That is, a discharge at a current based on the current source 21 is started. As a result, the voltage of the inverting input of the operational amplifier 25 (the voltage at the "b" point of FIG. 1A) slowly drops. The voltage of the capacitor 23 reaches a built-in voltage V2 of the rectifier element (diode) 22 at time t2. Thus, after the time t2, the voltage of the inverting input of the operational amplifier 25 (the voltage at the "b" point of FIG. 1A) is maintained at the constant voltage V2.

Embodiment 2

Figure 7:
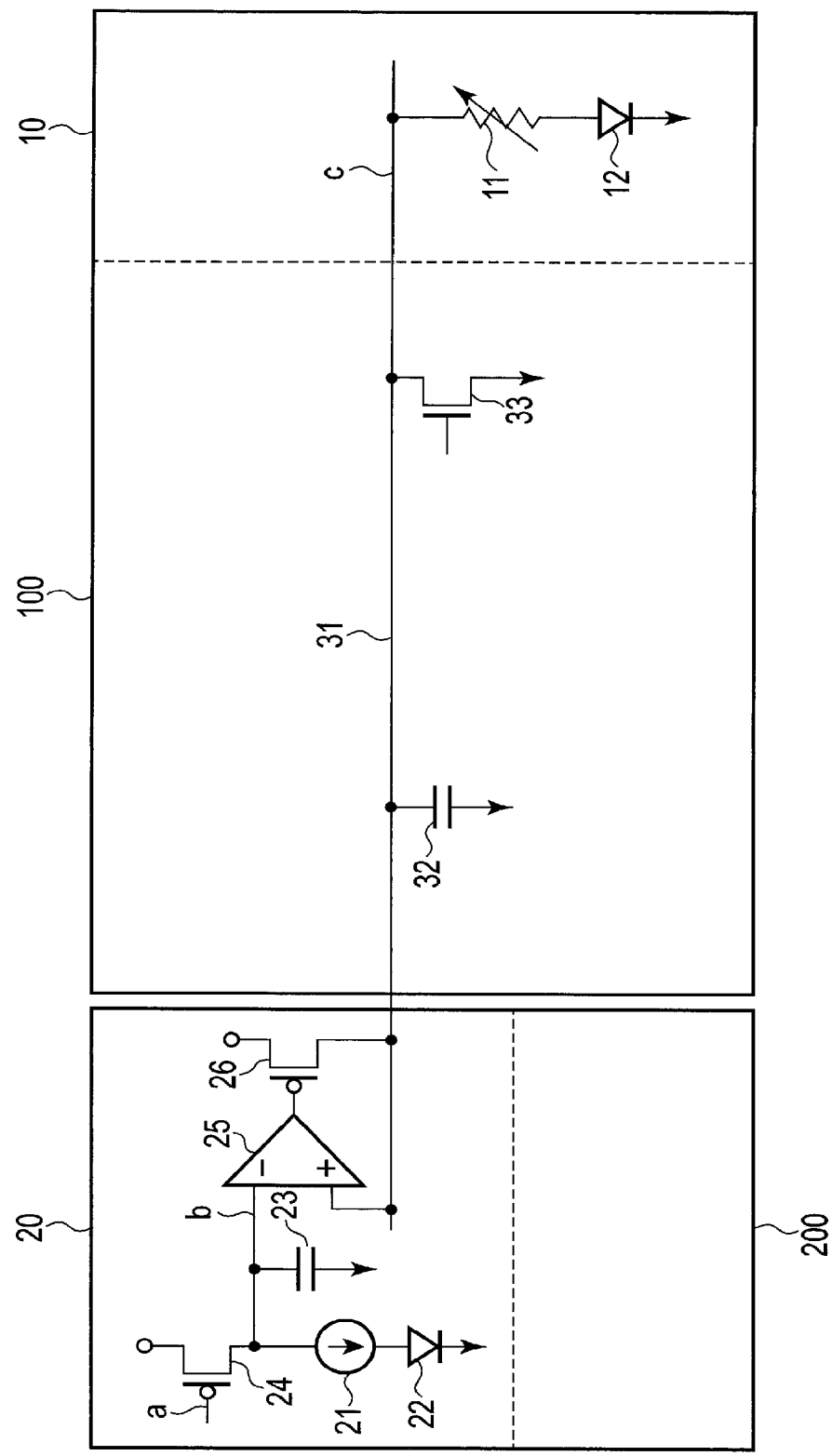
FIG. 7 is a circuit diagram illustrating a configuration of a memory device according to a second embodiment.

FIG. 7 is a circuit diagram illustrating a configuration of a memory device according to a second embodiment. Basic items of the second embodiment are similar to those of the first embodiment. Thus, description for items already described in the first embodiment will be omitted.

In the present embodiment, a bleeder circuit 33 is further provided in addition to the configuration of the first embodiment. The bleeder circuit 33 includes a NMOS transistor. The bleeder circuit 33 is connected to a bit line 31 which connects a first circuit 10 and a second circuit 20 to each other. With such a configuration, a bleeder current flows through the bleeder circuit 33. Thus, it is possible to stabilize a feedback loop of the second circuit 20.

The memory device of the present embodiment has a configuration similar to the configuration of the first embodiment. Thus, it is possible to obtain effects similar to the effects of the first embodiment. Further, in the present embodiment, it is possible to stabilize the feedback loop by the bleeder circuit 33.

Embodiment 3

Figure 8:
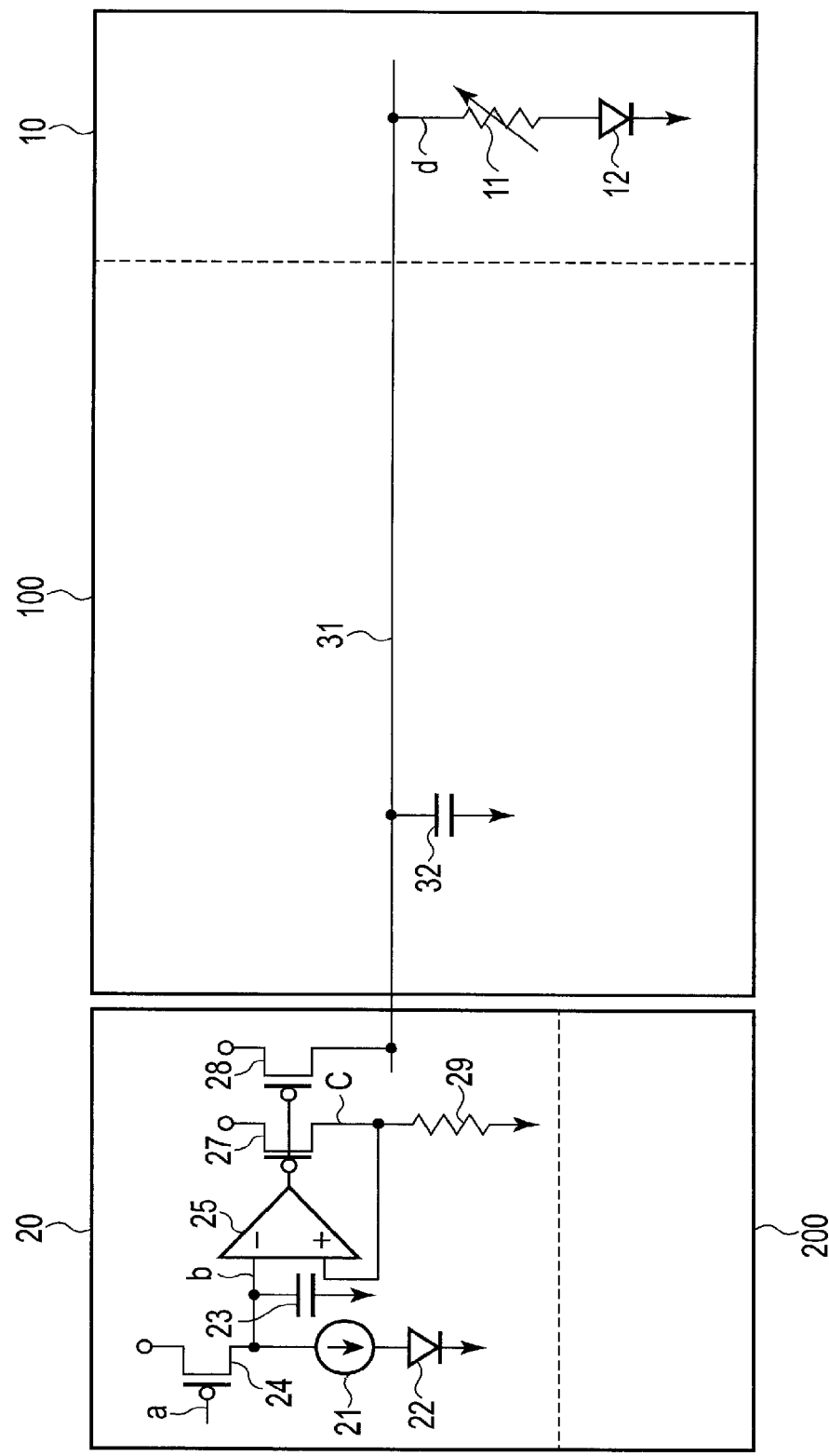
FIG. 8 is a circuit diagram illustrating a configuration of a memory device according to a third embodiment.

FIG. 8 is a circuit diagram illustrating a configuration of a memory device according to a third embodiment. Basic items of the third embodiment are similar to those of the first embodiment. Thus, description for items described in the first embodiment will be omitted.

The present embodiment is provided with a voltage-current conversion circuit which converts a voltage of a connection point between series connection of a current source 21 and a second rectifier element 22 and a capacitor 23 into a current. Specifically, the voltage-current conversion circuit includes an operational amplifier 25, a transistor 27, a transistor 28, and a resistor 29. The voltage of the connection point of the current source 21, the capacitor 23, and the transistor 24 is applied to an inverting input of the operational amplifier 25. A voltage of a connection point between the transistor 27 and a resistor 29 is applied to a non-inverting input of the operational amplifier 25. An output of the operational amplifier 25 is connected to gates of the transistors 27 and 28. A drain of the transistor 28 is connected to a bit line 31.

Figure 9:
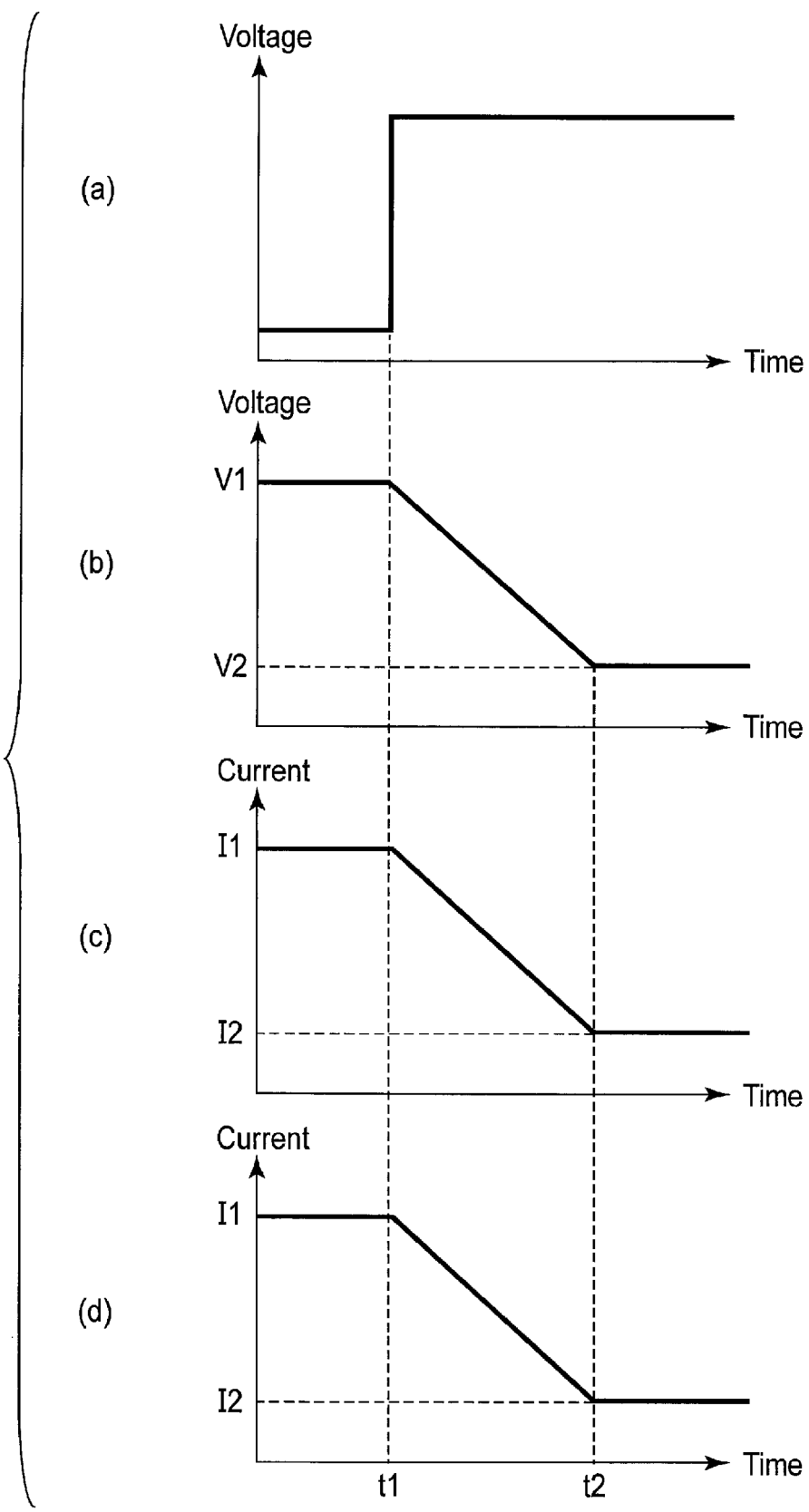
FIG. 9 is timing charts illustrating an operation when a resistance change memory element in the memory device according to the third embodiment is set to a low resistance state.

FIG. 9 is timing charts illustrating an operation when a resistance change memory element 11 is set to a low resistance state. FIG. 9(a) illustrates a voltage applied to a gate of the transistor 24 (a voltage at an "a" point of FIG. 8). FIG. 9(b) illustrates a voltage of the inverting input of the operational amplifier 25 (a voltage at a "b" point of FIG. 8). FIG. 9(c) illustrates a current flowing through series connection of the transistor 27 and the resistor 29 (a current at a "c" point of FIG. 8). FIG. 9(d) illustrates a current flowing through a first circuit 10 (a current at a "d" point of FIG. 8).

The transistor 24 is in an ON state, and the capacitor 23 is charged with a predetermined voltage V1 until time t1. Further, the current flowing through the series connection of the transistor 27 and the resistor 29 (the current at the "c" point of FIG. 8) is a constant current I1 until the time t1. When the transistor 24 is turned to an OFF state at the time t1, the capacitor 23 starts discharging. That is, a discharge at a current based on the current source 21 is started. As a result, the voltage of the inverting input of the operational amplifier 25 (the voltage at the "b" point of FIG. 8) slowly drops. The voltage of the capacitor 23 reaches a built-in voltage V2 of the rectifier element (diode) 22 at time t2. Thus, after the time t2, the voltage of the non-inverting input of the operational amplifier 25 is maintained at a constant voltage. Further, the current flowing through the series connection of the transistor 27 and the resistor 29 (the current at the "c" point of FIG. 8) is maintained at a constant current I2.

As already described above, the first circuit 10 has a mirror relationship with a second circuit 20. Thus, as illustrated in FIG. 9(c) and FIG. 9(d), the same current as the current flowing through the resistor 29 flows through the resistance change memory element 11 of the first circuit 10.

Also in the present embodiment, it is basically possible to obtain effects similar to the effects of the first embodiment. Further, in the present embodiment, it is possible to adjust a current ratio between the first circuit and the second circuit by adjusting a W/L (channel width W/channel length L) ratio of each of the PMOS transistor 27 and the PMOS transistor 28.

In the first to third embodiments described above, when the first rectifier element 12 is a predetermined two-terminal switch element (which is a two-terminal switch element containing elements which are the same as elements contained in the resistance change memory element 11 and formed of a material having a composition ratio which is the same as a composition ratio of a material of the resistance change memory element 11, a two-terminal switch element containing elements which are not the same as elements contained in the resistance change memory element 11, or a two-terminal switch element containing elements which are the same as elements contained in the resistance change memory element 11 and formed of a material having a composition ratio which is different from a composition ratio of a material of the resistance change memory element 11) and the second rectifier element 22 is a diode (pn junction diode), there may be a case where a threshold voltage (built-in potential) of the first rectifier element 12 and a threshold voltage (built-in potential) of the second rectifier element 22 are different from each other, as shown in FIG. 10A. In this case, in order to satisfy a mirror relationship between the first circuit 10 and the second circuit 20, it is preferable that the following relationship is satisfied.

When a threshold voltage (built-in potential) of the first rectifier element 12 (predetermined two-terminal switch element) is Vth1, a threshold voltage (built-in potential) of the second rectifier element 22 (pn junction diode) is Vth2, and Vth1>Vth2 is satisfied, FIG. 10A (a) corresponds to a characteristic of the first rectifier element 12, and FIG. 10A (b) corresponds to a characteristic of the second rectifier element 22. In this case, the mirror relationship can be maintained when the following relationship is satisfied, where VSL1 is a cathode voltage of the first rectifier element 12, and VSL2 is a cathode voltage of the second rectifier element 22.

$$\Delta V = Vth1 - Vth2 = VSL2 - VSL1$$

When Vth2>Vth1 is satisfied, FIG. 10A (a) corresponds to a characteristic of the second rectifier element 22, and FIG. 10A (b) corresponds to a characteristic of the first rectifier element 12. In this case, the mirror relationship can be maintained when the following relationship is satisfied, where VSL1 is a cathode voltage of the first rectifier element 12, and VSL2 is a cathode voltage of the second rectifier element 22.

$$\Delta V = Vth2 - Vth1 = VSL1 - VSL2$$

In the above described example, the threshold voltage (built-in potential) Vth1 of the first rectifier element 12 is defined as, in many cases, a voltage when a current flowing through the first rectifier element 12 is 1 [μA], 0.1 [μA] or 0.01 [μA]. It may be changed according to a manufacturer or a usage condition of a user.

In the above described example, the cathode voltage is adjusted based on the difference between the threshold voltage of the first rectifier element 12 and the threshold voltage of the second rectifier element 22, the cathode voltage may be adjusted based on the difference between anode voltages in the operation state.

As shown in FIG. 10B, there may be a case where the first rectifier element 12 and the second rectifier element 22 are different from each other in terms of function in addition to built-in potential. In such a case, important points for operation should be adjusted in spite of adjusting whole points.

Figure 11:
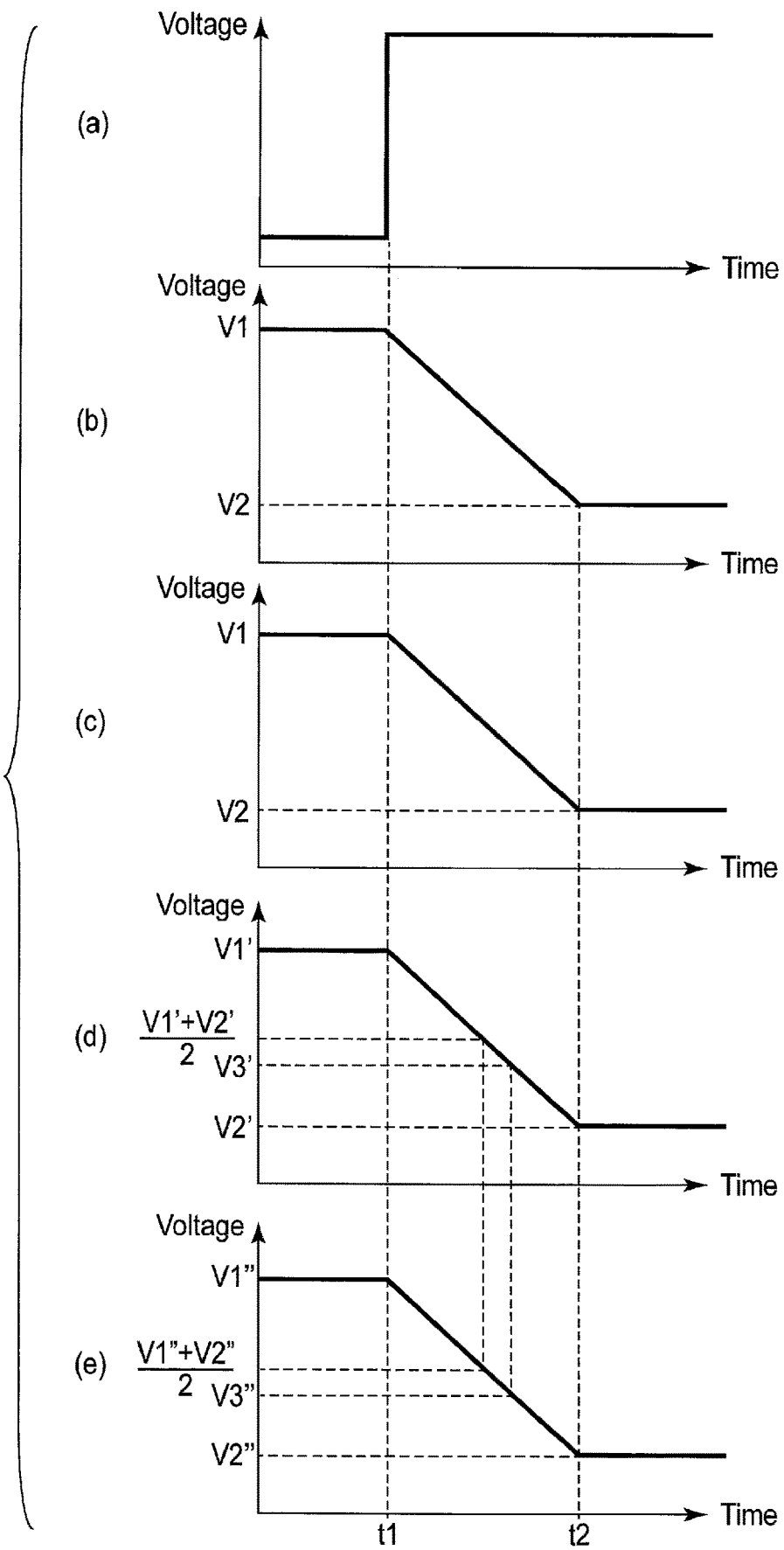
FIG. 11 shows operation waveforms in a state in which a cathode voltage of a first rectifier element and a cathode voltage of a second rectifier element are set to 0V.

FIG. 11 shows operation waveforms in a state in which the cathode voltage of the first rectifier element 12 and the cathode voltage of the second rectifier element 22 are set to 0V. At a time point when a potential discharge is started, the anode voltage of the first rectifier element 12 is V1', and the anode voltage of the second rectifier element 22 is V1". At a time point when a potential discharge is finished, the anode voltage of the first rectifier element 12 is V2', and the anode voltage of the second rectifier element 22 is V2". At a middle time point between the start point of the potential discharge and the end point of the potential discharge, the anode voltage of the first rectifier element 12 is (V1'+V2')/2, and the anode voltage of the second rectifier element 22 is (V1"+V2")/2. Further, when the phase change occurs in the element 11 which is important for operation, the anode voltage of the first rectifier element 12 is V3', the anode voltage of the second rectifier element 22 is V3".

Although a potential of a point "b" and a potential of a point "c" are the same by an operational amplifier 25, a potential of a point "d" and a potential of a point "e" are different from each other due to a difference between the first rectifier element 12 and the second rectifier element 22 (refer to FIG. 1A and FIG. 1B). When both characteristics coincide with each other at an important time point in terms of an operation, it is preferable that the following relationships are satisfied.

In a case where the both characteristics coincide with each other at the start point of discharge, it is preferable that the following relationships are satisfied.

In a case of $V1'>V1''$, it is preferable that the following relationship is satisfied.

$$\Delta V = V1' - V1'' = VSL2 - VSL1$$

In a case of $V1'<V1''$, it is preferable that the following relationship is satisfied.

$$\Delta V = V1'' - V1' = VSL1 - VSL2$$

In a case where the both characteristics coincide with each other at the end point of discharge, it is preferable that the following relationships are satisfied.

In a case of $V2'>V2''$, it is preferable that the following relationship is satisfied.

$$\Delta V = V2' - V2'' = VSL2 - VSL1$$

In a case of $V2'<V2''$, it is preferable that the following relationship is satisfied.

$$\Delta V = V2'' - V2' = VSL1 - VSL2$$

In a case where the both characteristics coincide with each other at the middle point between the start point of discharge and the end point of discharge, it is preferable that the following relationships are satisfied.

In a case of $(V1'+V2')/2 > (V1''+V2'')/2$, it is preferable that the following relationship is satisfied.

$$\Delta V = (V1'+V2')/2 - (V1''+V2'')/2 = VSL2 - VSL1$$

In a case of $(V1'+V2')/2 < (V1''+V2'')/2$, it is preferable that the following relationship is satisfied.

$$\Delta V = (V1''+V2'')/2 - (V1'+V2')/2 = VSL1 - VSL2$$

In a case where the both characteristics coincide with each other at the point at which the phase change occurs in the element 11, it is preferable that the following relationships are satisfied.

In a case of $V3'>V3''$, it is preferable that the following relationship is satisfied.

$$\Delta V = V3' - V3'' = VSL2 - VSL1$$

In a case of $V3'<V3''$, it is preferable that the following relationship is satisfied.

$$\Delta V = V3'' - V3' = VSL1 - VSL2$$

In the example described above, it is described that the both characteristics coincide with each other at the start point of discharge, at the end point of discharge, and at the middle point between the start point of discharge and the end point of discharge, the both characteristics can coincide with each other at a desired time point.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
   a first circuit comprising a resistance change memory element capable of setting a low resistance state or a high resistance state according to a falling speed of an applied voltage, and a first rectifier element connected in series to the resistance change memory element; and
   a second circuit comprising a current source, and a second rectifier element connected in series to the current source, the second circuit having a mirror relationship with the first circuit,
   wherein the second circuit further comprises:
   a capacitor connected in parallel to a series connection of the current source and the second rectifier element; and
   an operational amplifier including one input connected to a connection point between the series connection and the capacitor and another input connected to the first circuit.

2. The device according to claim 1, further comprising a bleeder circuit connected to a wiring line that connects the first circuit and the second circuit to each other.

3. The device according to claim 1, wherein the second circuit further comprises:
   a capacitor connected in parallel to a series connection of the current source and the second rectifier element; and
   a voltage-current conversion circuit that converts a voltage of a connection point between the series connection and the capacitor into a current.

4. The device according to claim 1, wherein the current source is a resistor element.

5. The device according to claim 1, wherein the current source is a resistance change memory element.

6. The device according to claim 1, wherein the first circuit is disposed in a memory cell array region, and the second circuit is disposed in a peripheral circuit region.

7. The device according to claim 5, wherein a configuration of a series connection of the resistance change memory element and the first rectifier element included in the first circuit is equivalent to a configuration of a series connection of the resistance change memory element and the second rectifier element included in the second circuit.

8. The device according to claim 1, wherein the first rectifier element is a diode, and the second rectifier element is a diode.

9. The device according to claim 1, wherein the first rectifier element is a two-terminal switch element containing elements which are the same as elements contained in the resistance change memory element and formed of a material having a composition ratio which is the same as a composition ratio of a material of the resistance change memory element.

10. The device according to claim 1, wherein the first rectifier element is a two-terminal switch element containing elements which are not the same as elements contained in the resistance change memory element, or a two-terminal switch element containing elements which are the same as elements contained in the resistance change memory element and formed of a material having a composition ratio which is different from a composition ratio of a material of the resistance change memory element.

11. The device according to claim 1, wherein the first rectifier element is a two-terminal switch element containing elements which are the same as elements contained in the resistance change memory element and formed of a material having a composition ratio which is the same as a composition ratio of a material of the resistance change memory element, and the second rectifier element is a diode.

12. The device according to claim 1, wherein
the first rectifier element is a two-terminal switch element containing elements which are not the same as elements contained in the resistance change memory element, or a two-terminal switch element containing elements which are the same as elements contained in the resistance change memory element and formed of a material having a composition ratio which is different from a composition ratio of a material of the resistance change memory element, and the second rectifier element is a diode.

13. The device according to claim 1, wherein
the first rectifier element is a two-terminal switch element containing elements which are the same as elements contained in the resistance change memory element and formed of a material having a composition ratio which is the same as a composition ratio of a material of the resistance change memory element, and the second rectifier element is a two-terminal switch element containing elements which are the same as elements contained in the resistance change memory element and formed of a material having a composition ratio which is the same as a composition ratio of a material of the resistance change memory element.

14. The device according to claim 1, wherein
the first rectifier element is a two-terminal switch element containing elements which are not the same as elements contained in the resistance change memory element, or a two-terminal switch element containing elements which are the same as elements contained in the resistance change memory element and formed of a material having a composition ratio which is different from a composition ratio of a material of the resistance change memory element, and the second rectifier element is a two-terminal switch element containing elements which are the same as elements contained in the first rectifier element and formed of a material having a composition ratio which is the same as a composition ratio of a material of the first rectifier element.

15. The device according to claim 1, wherein
the second rectifier element is a pn junction diode.

16. The device according to claim 1, wherein
the resistance change memory element contains germanium (Ge), antimony (Sb), and tellurium (Te).

17. The device according to claim 1, wherein
the first rectifier element contains germanium (Ge), antimony (Sb), and tellurium (Te).

18. The device according to claim 1, wherein
the second rectifier element contains silicon (Si).

19. The device according to claim 1, wherein
the following relationship is satisfied, $$Vth1-Vth2=VSL2-VSL1$$

where Vth1 is a threshold voltage of the first rectifier element, Vth2 is a threshold voltage of the second rectifier element, Vth1>Vth2, VSL1 is a cathode voltage of the first rectifier element, and VSL2 is a cathode voltage of the second rectifier element.

20. The device according to claim 19, wherein
the first rectifier element is a two-terminal switch element containing elements which are the same as elements contained in the resistance change memory element and formed of a material having a composition ratio which is the same as a composition ratio of a material of the resistance change memory element, a two-terminal switch element containing elements which are not the same as elements contained in the resistance change memory element, or a two-terminal switch element containing elements which are the same as elements contained in the resistance change memory element and formed of a material having a composition ratio which is different from a composition ratio of a material of the resistance change memory element, and the second rectifier element is a pn junction diode.

21. The device according to claim 1, wherein
the following relationship is satisfied, $$Vth2-Vth1=VSL1-VSL2$$

where Vth1 is a threshold voltage of the first rectifier element, Vth2 is a threshold voltage of the second rectifier element, Vth2>Vth1, VSL1 is a cathode voltage of the first rectifier element, and VSL2 is a cathode voltage of the second rectifier element.

22. The device according to claim 21, wherein
the first rectifier element is a two-terminal switch element containing elements which are the same as elements contained in the resistance change memory element and formed of a material having a composition ratio which is the same as a composition ratio of a material of the resistance change memory element, a two-terminal switch element containing elements which are not the same as elements contained in the resistance change memory element, or a two-terminal switch element containing elements which are the same as elements contained in the resistance change memory element and formed of a material having a composition ratio which is different from a composition ratio of a material of the resistance change memory element, and the second rectifier element is a pn junction diode.

23. The device according to claim 1, wherein assuming that an anode voltage of the first rectifier element is V1' and an anode voltage of the second rectifier element is V1" at a time point when a potential discharge is started in a state in which a cathode voltage of the first rectifier element and a cathode voltage of the second rectifier element are set to 0V, and in a case where V1'>V1" is satisfied, the following relationship is established, $$\Delta V=V1'-V1''=VSL2-VSL1.$$

24. The device according to claim 1, wherein assuming that an anode voltage of the first rectifier element is V1' and an anode voltage of the second rectifier element is V1" at a time point when a potential discharge is started in a state in which a cathode voltage of the first rectifier element and a cathode voltage of the second rectifier element are set to 0V, and in a case where V1'<V1" is satisfied, the following relationship is established, $$\Delta V=V1''-V1'=VSL1-VSL2.$$

25. The device according to claim 1, wherein assuming that an anode voltage of the first rectifier element is V2' and an anode voltage of the second rectifier element is V2" at a time point when a potential discharge is finished in a state in which a cathode voltage of the first rectifier element and a cathode voltage of the second rectifier element are set to 0V, and in a case where V2'>V2" is satisfied, the following relationship is established, $$\Delta V=V2'-V2''=VSL2-VSL1.$$

26. The device according to claim 1, wherein assuming that an anode voltage of the first rectifier element is V2' and an anode voltage of the second rectifier element is V2" at a time point when a potential discharge is finished in a state in which a cathode voltage of the first rectifier element and a cathode voltage of the second rectifier element are set to 0V, and in a case where V2'<V2" is satisfied, the following relationship is established, $$\Delta V = V2'' - V2' = VSL1 - VSL2.$$

27. The device according to claim 1, wherein assuming that an anode voltage of the first rectifier element is V1' and an anode voltage of the second rectifier element is V1" at a time point when a potential discharge is started, and an anode voltage of the first rectifier element is V2' and an anode voltage of the second rectifier element is V2" at a time point when a potential discharge is finished, in a state in which a cathode voltage of the first rectifier element and a cathode voltage of the second rectifier element are set to 0V, and in a case where (V1'+V2')/2>(V1"+V2")/2 is satisfied, the following relationship is established, $$\Delta V = (V1'+V2')/2 - (V1''+V2'')/2 = VSL2 - VSL1.$$

28. The device according to claim 1, wherein assuming that an anode voltage of the first rectifier element is V1' and an anode voltage of the second rectifier element is V1" at a time point when a potential discharge is started, and an anode voltage of the first rectifier element is V2' and an anode voltage of the second rectifier element is V2" at a time point when a potential discharge is finished, in a state in which a cathode voltage of the first rectifier element and a cathode voltage of the second rectifier element are set to 0V, and in a case where (V1'+V2')/2<(V1"+V2")/2 is satisfied, the following relationship is established, $$\Delta V = (V1''+V2'')/2 - (V1'+V2')/2 = VSL1 - VSL2.$$

29. The device according to claim 1, wherein assuming that an anode voltage of the first rectifier element is V3' and an anode voltage of the second rectifier element is V3" at a time point at which a phase change occurs in a state in which a cathode voltage of the first rectifier element and a cathode voltage of the second rectifier element are set to 0V, and in a case where V3'>V3" is satisfied, the following relationship is established, $$\Delta V = V3' - V3'' = VSL2 - VSL1.$$

30. The device according to claim 1, wherein assuming that an anode voltage of the first rectifier element is V3' and an anode voltage of the second rectifier element is V3" at a time point at which a phase change occurs in a state in which a cathode voltage of the first rectifier element and a cathode voltage of the second rectifier element are set to 0V, and in a case where V3'<V3" is satisfied, the following relationship is established, $$\Delta V = V3'' - V3' = VSL1 - VSL2.$$

* * * * *